(12) United States Patent
Basceri

(10) Patent No.: US 7,309,889 B2
(45) Date of Patent: Dec. 18, 2007

(54) CONSTRUCTIONS COMPRISING PEROVSKITE-TYPE DIELECTRIC

(75) Inventor: Cem Basceri, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 2 days.

(21) Appl. No.: 11/119,127

(22) Filed: Apr. 29, 2005

(65) Prior Publication Data

US 2005/0191766 A1 Sep. 1, 2005

Related U.S. Application Data

(62) Division of application No. 10/302,043, filed on Nov. 21, 2002, now Pat. No. 6,958,267, which is a division of application No. 09/932,003, filed on Aug. 17, 2001, now Pat. No. 7,011,978.

(51) Int. Cl.
*H01L 27/108* (2006.01)
*H01L 29/76* (2006.01)

(52) U.S. Cl. ................................. 257/296; 257/295

(58) Field of Classification Search ................ None
See application file for complete search history.

(56) References Cited

U.S. PATENT DOCUMENTS

| | | | |
|---|---|---|---|
| 4,105,810 A | 8/1978 | Yamazaki et al. |
| 4,261,698 A | 4/1981 | Carr et al. |
| 4,691,662 A | 9/1987 | Roppel et al. |
| 5,006,363 A | 4/1991 | Fujii et al. |
| 5,164,363 A | 11/1992 | Eguchi et al. |
| 5,183,510 A | 2/1993 | Kimura |
| 5,254,505 A | 10/1993 | Kamiyama |
| 5,256,455 A | 10/1993 | Numasawa |

(Continued)

FOREIGN PATENT DOCUMENTS

EP 0 030 798 6/1981

(Continued)

OTHER PUBLICATIONS

Bilodeau, S. et al., *Composition Dependence of the Dielectric Properties of MOCVD $Ba_xSr_{1-x}TiO_3$*, pp. 1-21 (MRS Fall Meeting Dec. 1, 1994).

(Continued)

*Primary Examiner*—Kiesha Rose
(74) *Attorney, Agent, or Firm*—Wells St. John P.S.

(57) ABSTRACT

The invention includes a capacitor construction. A capacitor electrode has a perovskite-type dielectric material thereover. The perovskite-type dielectric material has an edge region proximate the electrode, and a portion further from the electrode than the edge region. The portion has a different amount of crystallinity than the edge region. The invention also includes a method of forming a capacitor construction. A capacitor electrode is provided, and a perovskite-type dielectric material is chemical vapor deposited over the first capacitor electrode. The depositing includes flowing at least one metal organic precursor into a reaction chamber and forming a component of the perovskite-type dielectric material from the precursor. The precursor is exposed to different oxidizing conditions during formation of the perovskite-type dielectric material so that a first region of the dielectric material has more amorphous character than a second region of the dielectric material.

5 Claims, 2 Drawing Sheets

U.S. PATENT DOCUMENTS

| | | | |
|---|---|---|---|
| 5,261,961 A | 11/1993 | Takasu et al. | |
| 5,270,241 A | 12/1993 | Dennison et al. | |
| 5,312,783 A | 5/1994 | Takasaki et al. | |
| 5,392,189 A | 2/1995 | Fazan et al. | |
| 5,395,771 A | 3/1995 | Nakato | |
| 5,459,635 A | 10/1995 | Tomozawa et al. | |
| 5,468,687 A | 11/1995 | Carl et al. | |
| 5,470,398 A | 11/1995 | Shibuya et al. | |
| 5,525,156 A | 6/1996 | Manada et al. | |
| 5,596,214 A | 1/1997 | Endo | |
| 5,614,018 A | 3/1997 | Azuma et al. | |
| 5,618,761 A | 4/1997 | Eguchi et al. | |
| 5,635,741 A | 6/1997 | Tsu et al. | |
| 5,656,329 A | 8/1997 | Hampden-Smith | |
| 5,663,089 A | 9/1997 | Tomozawa et al. | |
| 5,702,562 A | 12/1997 | Wakahara | |
| 5,711,816 A | 1/1998 | Kirlin et al. | |
| 5,719,417 A | 2/1998 | Roeder et al. | |
| 5,723,361 A | 3/1998 | Azuma et al. | |
| 5,731,948 A | 3/1998 | Yializis et al. | |
| 5,736,759 A | 4/1998 | Haushaalter | |
| 5,776,254 A | 7/1998 | Yuuki et al. | |
| 5,783,253 A | 7/1998 | Roh | |
| 5,798,903 A | 8/1998 | Dhote et al. | |
| 5,834,060 A | 11/1998 | Kawahara et al. | |
| 5,909,043 A | 6/1999 | Summerfelt | |
| 5,972,430 A | 10/1999 | DiMeo, Jr. et al. | |
| 5,976,990 A | 11/1999 | Mercaldi et al. | |
| 5,989,927 A | 11/1999 | Yamonobe | |
| 6,025,222 A | 2/2000 | Kimura et al. | |
| 6,037,205 A | 3/2000 | Huh et al. | |
| 6,043,526 A | 3/2000 | Ochiai | |
| 6,046,345 A | 4/2000 | Kadokura et al. | |
| 6,078,492 A | 6/2000 | Huang et al. | |
| 6,090,443 A | 7/2000 | Eastep | |
| 6,101,085 A | 8/2000 | Kawahara et al. | |
| 6,126,753 A | 10/2000 | Shinriki et al. | |
| 6,127,218 A | 10/2000 | Kang | |
| 6,143,597 A | 11/2000 | Matsuda et al. | |
| 6,143,679 A | 11/2000 | Nagasawa | |
| 6,146,907 A | 11/2000 | Xiang et al. | |
| 6,150,684 A | 11/2000 | Sone | |
| 6,153,898 A | 11/2000 | Watanabe et al. | |
| 6,156,638 A | 12/2000 | Agarwal et al. | |
| 6,165,834 A | 12/2000 | Agarwal et al. | |
| 6,211,096 B1 | 4/2001 | Allman | |
| 6,215,650 B1 | 4/2001 | Gnade et al. | |
| 6,236,076 B1 | 5/2001 | Arita et al. | |
| 6,238,734 B1 | 5/2001 | Senzaki et al. | |
| 6,245,652 B1 | 6/2001 | Gardner et al. | |
| 6,258,170 B1 | 7/2001 | Somekh | |
| 6,258,654 B1 | 7/2001 | Gocho | |
| 6,277,436 B1 | 8/2001 | Stauf et al. | |
| 6,285,051 B1 | 9/2001 | Ueda et al. | |
| 6,287,935 B1 | 9/2001 | Coursey | |
| 6,323,057 B1 * | 11/2001 | Sone | 438/104 |
| 6,325,017 B1 | 12/2001 | DeBoer et al. | |
| 6,335,049 B1 | 1/2002 | Basceri | |
| 6,335,302 B1 | 1/2002 | Satoh | |
| 6,337,496 B2 | 1/2002 | Jung | |
| 6,338,970 B1 | 1/2002 | Suh | |
| 6,362,068 B1 | 3/2002 | Summerfelt | |
| 6,372,686 B1 | 4/2002 | Golden | |
| 6,422,281 B1 | 7/2002 | Ensign, Jr. et al. | |
| 6,500,487 B1 | 12/2002 | Holst et al. | |
| 6,507,060 B2 * | 1/2003 | Ren et al. | 257/295 |
| 6,525,365 B1 | 2/2003 | Basceri et al. | |
| 6,527,028 B2 | 3/2003 | Miller et al. | |
| 6,558,517 B2 | 5/2003 | Basceri | |
| 6,566,147 B2 | 5/2003 | Basceri et al. | |
| 6,602,376 B1 | 8/2003 | Bradshaw | |
| 6,727,140 B2 | 4/2004 | Basceri et al. | |
| 6,838,122 B2 | 1/2005 | Basceri et al. | |
| 6,838,293 B2 | 1/2005 | Basceri et al. | |
| 6,878,602 B2 | 4/2005 | Basceri et al. | |
| 6,884,475 B2 | 4/2005 | Basceri | |
| 6,908,639 B2 | 6/2005 | Basceri et al. | |
| 6,943,392 B2 | 9/2005 | Agarwal et al. | |
| 6,952,029 B1 | 10/2005 | Basceri | |
| 6,962,824 B2 | 11/2005 | Basceri et al. | |
| 6,982,103 B2 | 1/2006 | Basceri et al. | |
| 7,005,695 B1 * | 2/2006 | Agarwal | 257/310 |
| 7,011,978 B2 | 3/2006 | Basceri | |
| 7,023,043 B2 | 4/2006 | Basceri et al. | |
| 7,029,985 B2 | 4/2006 | Basceri et al. | |
| 7,052,584 B2 | 5/2006 | Basceri | |
| 7,073,730 B2 | 7/2006 | Haag et al. | |
| 7,208,198 B2 | 4/2007 | Basceri et al. | |
| 7,217,617 B2 | 5/2007 | Basceri | |

FOREIGN PATENT DOCUMENTS

| | | |
|---|---|---|
| EP | 0 306 069 A2 | 3/1989 |
| EP | 0 388 957 A2 | 9/1990 |
| EP | 0 474 140 A1 | 3/1992 |
| EP | 0 810 666 A1 | 12/1997 |
| EP | 0 835 950 A1 | 4/1998 |
| EP | 0 855 735 A2 | 7/1998 |
| EP | 0 892 426 A2 | 1/1999 |
| EP | 0 957 522 A2 | 11/1999 |
| GB | 2 194 555 A | 3/1988 |
| JP | 2250970 | 10/1990 |
| JP | 04-24922 | 1/1992 |
| JP | 04-115533 | 4/1992 |
| JP | 04-180566 | 6/1992 |
| JP | 08-060347 | 3/1996 |
| JP | 2000091333 | 3/2000 |
| WO | WO98/39497 | 9/1998 |
| WO | WO99/64645 | 12/1999 |
| WO | WO 01/16395 | 3/2001 |

OTHER PUBLICATIONS

Bilodeau, S. et al., *MOCVD BST for High Density DRAM Applications* (Preprint for Semicon/West Jul. 12, 1995), 2 pages.

Choi, Y-C et al., Abstract, *Improvements of the Properties of Chemical-Vapor-Deposited $(Ba,Sr)TiO_3$ Films Through Use of a Seed Layer*, 36 Jpn. J. Appl. Phys. Pt. 1, No. 11, pp. 6824-6828 (1997), 1 sheet.

Chu, C. et al., Abstract, *Electrical properties and crystal structure of $(Ba,Sr)TiO_3$ films prepared at low temperatures on a $LaNiO_3$ electrode by radio-frequency magnetron sputtering*, 70 Applied Physics Letters No. 2, pp. 249-251 (1997), 1 sheet.

Eguchi, K. et al., Abstract, *Chemical vapor deposition of $(Ba,Sr)TiO_3$ thin films for application in gigabit scale dynamic random access memories*, 14 Integrated Ferroelectrics Nos. 1-4, Pt. 1, pp. 33-42 (1997), 1 sheet.

Jia,Q. et al., Abstract, *Structural and dielectric properties of $Ba_{0.5}Sr_{0.5}TiO_3$ thin films with an epi-$RuO_2$ bottom electrode*, 19 Integrated Ferroelectrics Nos. 1-4, pp. 111-119 (1998), 1 sheet.

Kawahara, T. et al., *(Ba, Sr)$TiO_3$ Films Prepared by Liquid Source Chemical Vapor Deposition on Ru Electrodes*, 35 Jpn. J. Appl. Phys. Pt. 1, No. 9B, pp. 4880, 4883 (1996).

Khamankar, R. et al., *A Novel Low-Temperature Process for High Dielectric Constant BST Thin Films for ULSI DRAM Applications*, Microelectronics Research Center, Univ. of Texas at Austin, TX (1994), 2 pages.

Kim, Y. et al., Abstract, *Advantages of $RuO_x$ bottom electrode in the dielectric and leakage characteristics of $(Ba,Sr)TiO_3$ capacitor*, 35 Jpn. J. Appl. Phys. Pt. 1, No. 12A, pp. 6153-6156 (1996), 1 sheet.

Paek, S. et al., Abstract, *Characterization of MIS capacitor of BST thin films deposited on Si by RF magnetron sputtering*, Ferroelectric Thin Films V. Symposium, San Francisco, CA, pp. 33-38 (Apr. 7, 1996), 1 sheet.

Takeuchi, N. et al., Abstract, *Effect of firing atmosphere on the cubic-hexagonal transition in $Ba_{0.99}Sr_{.01}TiO_3$*, 98 Nippon Seramikkusu Kyokai Gakujutsu Ronbunshi No. 8, pp. 836-839 (1990), 1 sheet.

Yamaguchi, H. et al., Abstract *Reactive coevaporation synthesis and characterization of $SrTiO_3$-$BaTiO_3$ thin films*, IEEE International Sympos. on Applications of Ferroelectrics, Greenville, SC, pp. 285-288 (Aug. 30, 1992), 1 sheet.

Yamamichi, S. et al., Abstract, *Ba+Sr/Ti ratio dependence of the dielectric properties for $(Ba_{0.5})Sr_{0.5}TiO_3$ thin films prepared by ion beam sputtering*, 64 Applied Physics Letters No. 13, pp. 1644-1646 (1994), 1 sheet.

Yamamuka, M. et al., Abstract, *Thermal-Desorption Spectroscopy of (Ba,Sr)$TiO_3$ Thin-Films Prepared by Chemical-Vapor-Deposition*, 35 Jpn. J. of Appl. Phys. Pt. 1, No. 2A, pp. 729-735 (1996), 1 sheet.

Arai, T. et al., *Preparation of $SrTiO_3$ Films on 8-Inch Wafers by Chemical Vapor Deposition*, Jpn. J. of Appl. Phys., vol. 35, No. 9B, Part 1, Sep. 1996, pp. 4875-4879.

Kim, et al., Structural and Electrical Properties of $BaTiO_3$ *Grown on p-InP (100) by Low-Pressure Metalorganic Chemical Vapor Deposition at Low Temperature*, Appl. Phys. Letters, vol. 65, No. 15, Oct. 10, 1994, pp. 1955-1957.

Basceri, Cem et al., *The Dielectric Response as a Function of Temperature and Film Thickness of Fiber-Textured (Ba,Sr)$TiO_3$ Thin Films Grown by Chemical Vapor Deposition*, J. Appl. Phys. 82(5), Sep. 1, 1997, pp. 2497-2504.

Dissertation: Basceri, Cem, *Electrical and Dielectric Properties of (Ba,Sr)$TiO_3$ Thin Film Capacitors for Ultra-High Density Dynamic Random Access Memories*, 1997, 171 pgs.

Aoyama, T. et al., *Leakage Current Mechanism of Amorphous and Polycrystalline $Ta_2O_5$ Films Grown by Chemical Vapor Deposition*, J. Electrochem. Soc. vol. 143, No. 3, Mar. 1996, pp. 977-983.

Stemmer, S. et al., *Accommodation of nonstoichiometry in (100) fiber-textured $(Ba_xSr_{1-x})Ti_{1+y}O_{3+z}$ thin films grown by chemical vapor deposition*, App. Phys. Lett. vol. 74, No. 17, Apr. 26, 1999, pp. 2432-2434.

Streiffer, S. et al., *Ferroelectricity in thin films: The dielectric response of fiber-textured $(Ba_x Sr_{1-x})Ti_{1+y}O_{3+z}$ thin films grown by chemical vapor deposition*, J. Appl. Physics, vol. 86, No. 8, (Oct. 15, 1999), pp. 4565-4575.

Website: "Torr", Definition of Torr, http://en.wikipedia.org/wiki/Torr, reprinted Jan. 6, 2007, 2 pages.

Website: "Standardkubikzentimeter/Flow Measurement" Definition of Sccm, http://de.wikipedia.org/wiki/Sccm, reprinted Jan. 6, 2007, 2 pages.

* cited by examiner

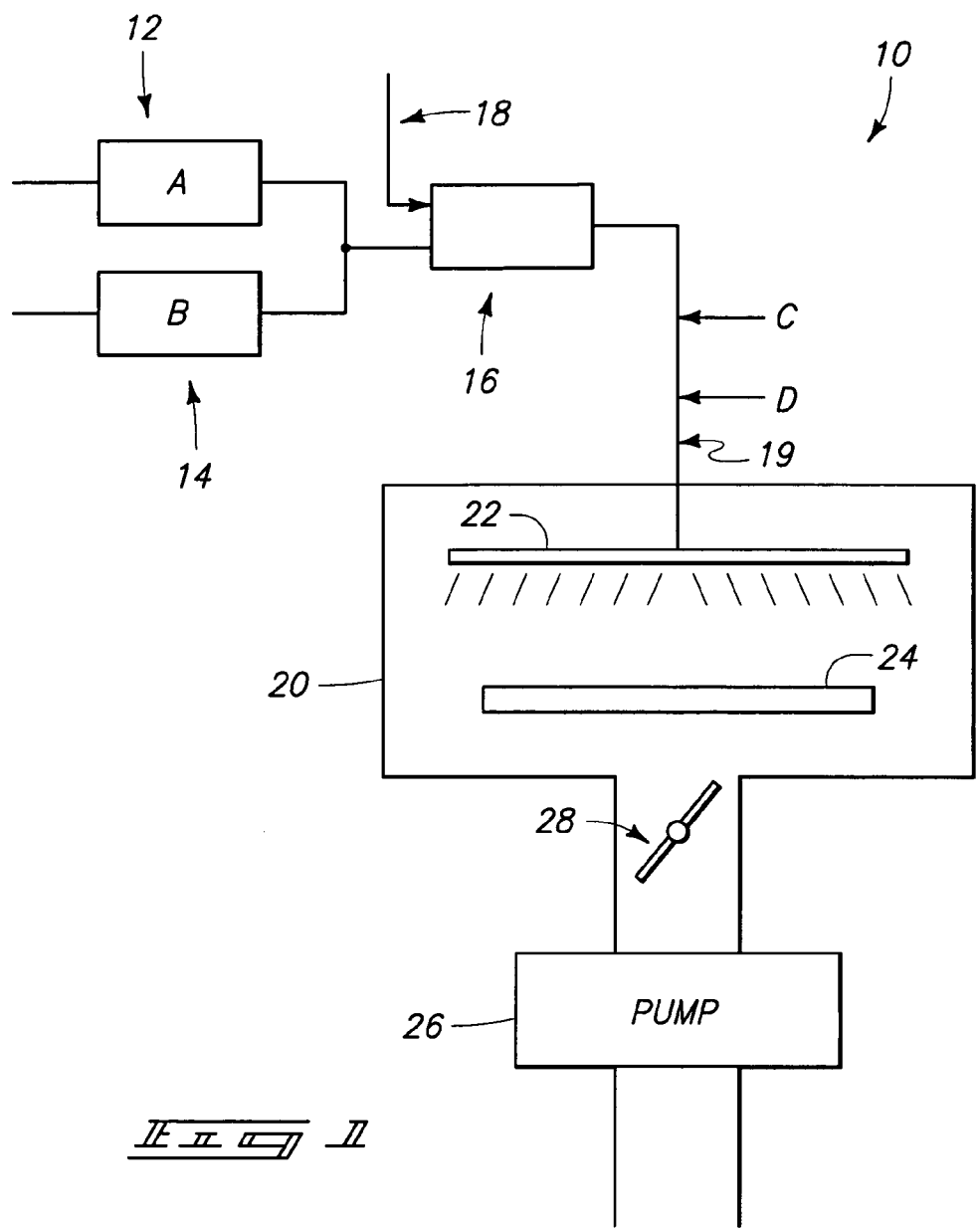
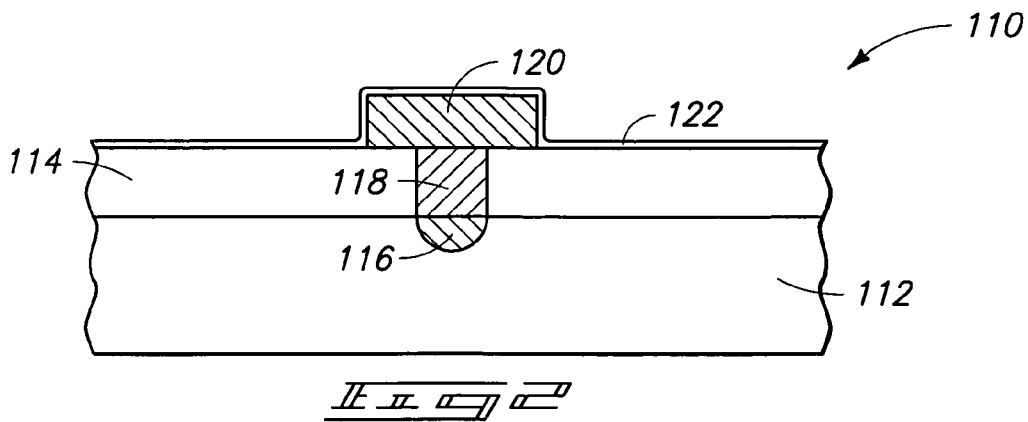

CONSTRUCTIONS COMPRISING PEROVSKITE-TYPE DIELECTRIC

RELATED PATENT DATA

This patent resulted from a divisional of U.S. patent application Ser. No. 10/302,043, which was filed Nov. 21, 2002 now U.S. Pat. No. 6,958,267; and which resulted from a divisional application of U.S. patent application Ser. No. 09/932,003, which was filed on Aug. 17, 2001 now U.S. Pat. No. 7,011,978.

TECHNICAL FIELD

This invention relates to chemical vapor deposition methods of forming perovskite-type dielectric materials (such as barium strontium titanate) within capacitor constructions, and to capacitor constructions comprising perovskite-type dielectric materials.

BACKGROUND OF THE INVENTION

As DRAMs increase in memory cell density, there is a continuing challenge to maintain sufficiently high storage capacitance despite decreasing cell area. Additionally, there is a continuing goal to further decrease cell area. One principal way of increasing cell capacitance is through cell structure techniques. Such techniques include three-dimensional cell capacitors, such as trenched or stacked capacitors. Yet as feature size continues to become smaller and smaller, development of improved materials for cell dielectrics as well as the cell structure are important. The feature size of 256 Mb DRAMs and beyond will be on the order of 0.25 micron or less, and conventional dielectrics such as $SiO_2$ and $Si_3N_4$ might not be suitable because of small dielectric constants.

Highly integrated memory devices are expected to require a very thin dielectric films for the 3-dimensional capacitors of cylindrically stacked or trench structures. To meet this requirement, the capacitor dielectric film thickness will be below 2.5 nm of $SiO_2$ equivalent thickness.

Insulating inorganic metal oxide materials (such as ferroelectric materials, perovskite-type materials and pentoxides) are commonly referred to as "high k" materials due to their high dielectric constants, which make them attractive as dielectric materials in capacitors, for example for high density DRAMs and non-volatile memories. Using such materials enables the creation of much smaller and simpler capacitor structures for a given stored charge requirement, enabling the packing density dictated by future circuit design. One such known material is barium strontium titanate. For purposes of interpreting this disclosure and the claims that follow, a "perovskite-type material" is defined to be any material substantially having a perovskite-type crystal structure, including perovskite itself ($CaTiO_3$), and other materials. The crystal structure is referred to as "substantially" a perovskite-type crystal structure to indicate that there can be slight distortions of the structure corresponding to a theoretically ideal perovskite crystal structure in many of the materials having perovskite crystal structures, including, for example, perovskite itself.

It would be desired to develop improved methods of incorporating high k materials into capacitor constructions, and it would particularly be desirable to develop improved methods for incorporating perovskite-type materials into capacitor constructions.

SUMMARY OF THE INVENTION

In one aspect, the invention includes a capacitor construction. A first capacitor electrode has a perovskite-type dielectric material thereover. The perovskite-type dielectric material has a first edge region proximate the first electrode. The perovskite-type dielectric material also has a portion further from the first electrode than the first edge region. The portion further from the first electrode than the first edge region has a different amount of crystallinity than the first edge region. A second capacitor electrode is over the perovskite-type dielectric material.

In another aspect, the invention includes a method of forming a capacitor construction. A first capacitor electrode is provided, and a perovskite-type dielectric material is chemical vapor deposited over the first capacitor electrode. The chemical vapor depositing includes flowing at least one metal organic precursor into a reaction chamber and forming a component of the perovskite-type dielectric material from the precursor. The precursor is exposed to different oxidizing conditions during formation of the perovskite-type dielectric material so that a first region of the dielectric material has more amorphous character than a second region of the perovskite-type dielectric material that is formed subsequent to the first region. A second capacitor electrode is formed over the perovskite-type dielectric material.

BRIEF DESCRIPTION OF THE DRAWINGS

Preferred embodiments of the invention are described below with reference to the following accompanying drawings.

FIG. 1 is schematic diagram of an exemplary system usable in accordance with an aspect of the invention.

FIG. 2 a diagrammatic cross-sectional view of a semiconductor wafer fragment in process in accordance with an aspect of the invention.

DETAILED DESCRIPTION OF THE PREFERRED EMBODIMENTS

Figure 3:
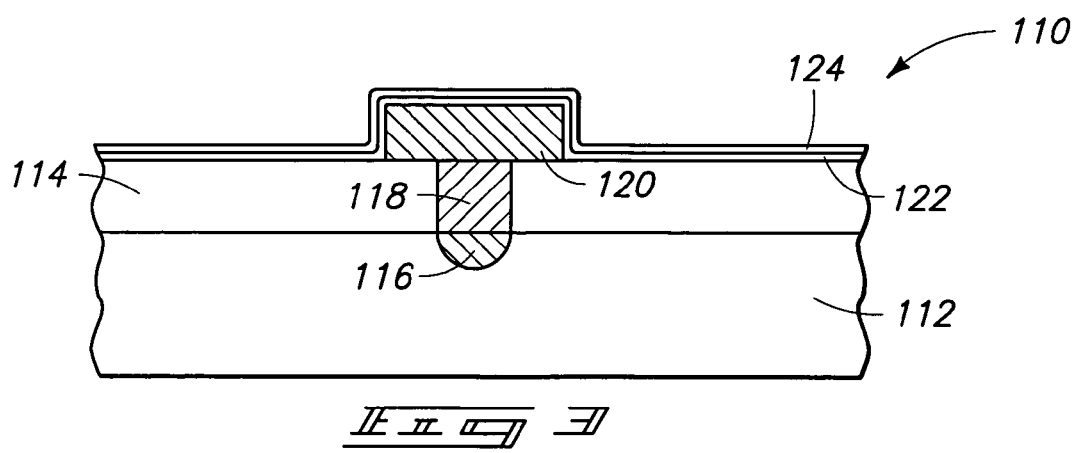
FIG. 3 is a view of the FIG. 2 wafer fragment shown at a processing step subsequent to that of FIG. 2.

The prior art recognizes the desirability in certain instances of fabricating barium strontium titanate dielectric regions of capacitors to have variable concentration at different elevational locations in the thickness of such regions of barium and strontium. The typical prior art method of providing variable stoichiometry of barium and strontium at selected locations within the thickness of a barium strontium titanate dielectric region is to vary the flows of the barium and strontium precursors to the reactor during a chemical vapor deposition (which may or may not be plasma enhanced). For example, increasing or decreasing the flow of the barium precursor or the strontium precursor will impact the atomic ratio of barium to strontium in the deposited barium strontium titanate layer. In some instances, separate barium and strontium precursors are mixed in the vapor phase, and the vapor mixture is flowed to the reactor.

FIG. 1 diagrammatically illustrates but one chemical vapor deposition system 10 in accordance with but one implementation of a chemical vapor deposition method in accordance with an aspect of the invention. Such comprises an A precursor feed stream 12 and a B precursor feed stream 14. Such combine and feed to a vaporizer 16. An inert gas stream 18 can also be provided to vaporizer 16 to facilitate flow of the vaporized precursors to a downstream chamber.

A chemical vapor deposition chamber 20 is connected downstream of vaporizer 16. Such includes a showerhead 22 for receiving and distributing gaseous precursors therein. A suitable wafer holder 24 is received within chamber 20. Oxidizer gas feed streams, for example two oxidizer feed streams C and D, are preferably provided upstream of the showerhead. Further, an additional inert gas feed stream 19 is shown positioned between the oxidizer feed streams and chamber. More or less feed streams with or without mixing might also of course be utilized. The deposition is preferably conducted at subatmospheric pressure, with a vacuum pump 26 and an exemplary valve 28 being diagrammatically illustrated for achieving a desired vacuum pressure within chamber 20. Further, the deposition may or may not be plasma enhanced.

In one example, and by way of example only, the A stream consists essentially of a mixture of Ba and Sr precursors (i.e., preferably about 50%-50% by volume), and the B stream consists essentially of Ti. Example preferred deposition is by metal organic chemical vapor deposition (MOCVD) processes, with at least one oxidizer being provided within chamber 20 with suitable MOCVD precursors to deposit a desired barium strontium titanate comprising dielectric layer. Example precursors, and by way of example only, include:

| | |
|---|---|
| $Ba(thd)_2$ | bis(tetramethylheptanedionate) |
| $Sr(thd)_2$ | bis(tetramethylheptanedionate) |
| $Ti(thd)_2(O-i-Pr)_2$ | (isopropoxide)bis(tetramethylheptanedionate) |
| $Ba(thd)_2$ | bis(tetramethylheptanedionate) |
| $Sr(thd)_2$ | bis(tetramethylheptanedionate) |
| $Ti(dmae)_4$ | bis(dimethylaminoethoxide) |
| $Ba(methd)_2$ | bis(methoxyethoxyte, hetramethylheptanedionate) |
| $Sr(methd)_2$ | bis(methoxyethoxyte, tetramethylheptanedionate) |
| $Ti(mpd)(thd)_2$ | bis(methylpentanediol, tetramethylheptanedionate) |
| $Ba(dpm)_2$ | bis(dipivaloylmethanato) |
| $Sr(dpm)_2$ | bis(dipivaloylmethanato) |
| $TiO(dpm)_2$ | (titanyl)bis(dipivaloylmethanato) |
| $Ba(dpm)_2$ | bis(dipivaloylmethanato) |
| $Sr(dpm)_2$ | bis(dipivaloylmethanato) |
| $Ti(t-BuO)_2(dpm)_2$ | (t-butoxy)bis(dipivaloylmethanato) |
| $Ba(dpm)_2$ | bis(dipivaloylmethanato) |
| $Sr(dpm)_2$ | bis(dipivaloylmethanato) |
| $Ti(OCH_3)_2(dpm)_2$ | (methoxy)bis(dipivaloylmethanato) |

Adducts (i.e., tetraglyme, trietherdiamine, pentamethyidlethlyenetriamine), solvents (i.e., butylacetate, methanol, tetrahydrofuran), and/or other materials might be utilized with the precursors. By way of example only, and where the precursors include metal organic precursors, example flow rates for the various of such precursors include anywhere from 10 mg/min. to 1000 mg/min. of liquid feed to any suitable vaporizer.

An exemplary method of the invention is described in connection with a chemical vapor deposition method of forming a barium strontium titanate comprising dielectric mass having a varied concentration of crystallinity within the layer. Such method is described with reference to FIGS. 2–5. FIG. 2 depicts an exemplary semiconductor construction 110 comprising a bulk monocrystalline silicon substrate 112. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

An insulative layer 114, such as borophosphosilicate glass (BPSG) by way of example only, is formed over substrate 112. An opening extends through the insulative layer 114 and to an electrical node 116 supported by substrate 112. In the shown embodiment, electrical node 116 is a diffusion region formed within substrate 112. Such diffusion region can comprise n-type or p-type conductivity-enhancing dopant. A conductive interconnect 118 extends through the opening in insulative layer 114 and electrically connects with diffusion region 116. A conductive capacitor electrode layer 120, such as platinum or an alloy thereof by way of example only, is formed over layer 114. Layer 120 can be referred to as a first capacitor electrode.

A perovskite-type dielectric material 122 is chemical vapor deposited over first capacitor electrode 120. Perovskite-type material 122 can comprise, for example, one or more of barium strontium titanate, barium titanate, lead zirconium titanate, and lanthanum doped lead zirconium titanate. In particular embodiments, perovskite-type material 122 can comprise titanium and oxygen, together with one or more of barium, strontium, lead and zirconium. In further embodiments, perovskite-type material 122 can comprise, consist essentially of, or consist of barium, strontium, titanium and oxygen. Layer 122 has a first degree of crystallinity, and in particular embodiments is substantially amorphous (i.e., the first degree of crystallinity is less than 10%, as can be determined by, for example, x-ray crystallography).

Referring to FIG. 3, a second perovskite-type dielectric material 124 is chemical vapor deposited over first material 122. Second material 124 can comprise any of the various perovskite-type materials discussed above with reference to layer 122, but comprises a different degree of crystallinity than does layer 122. In particular embodiments, layer 124 comprises a higher degree of crystallinity than does layer 122. In preferred embodiments, layer 124 is substantially crystalline (i.e., is greater than 90% crystalline, as can be determined by x-ray diffraction), and layer 122 is substantially amorphous.

Figure 4:
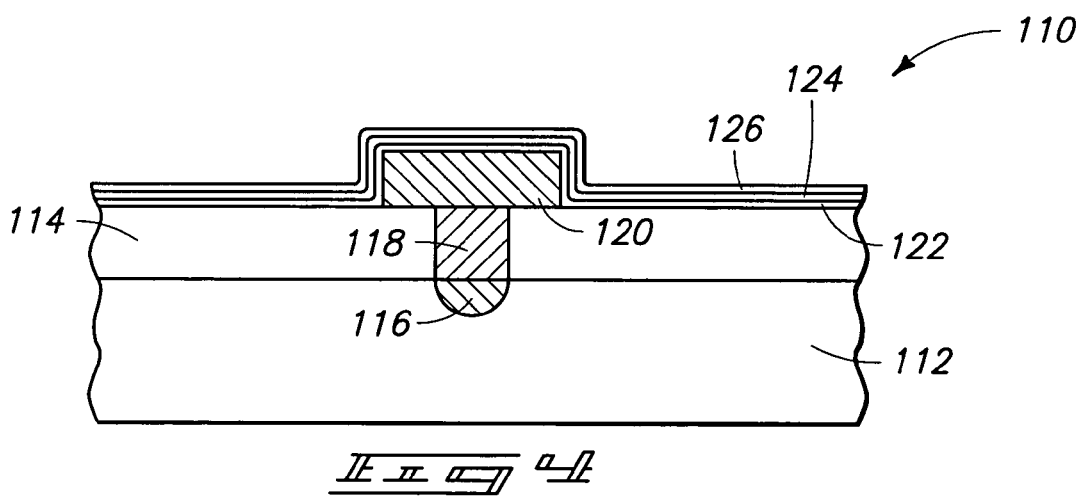
FIG. 4 is a view of the FIG. 2 wafer fragment shown at a processing step subsequent to that of FIG. 3.

Referring to FIG. 4, a third layer of perovskite-type material 126 is provided over second layer 124. Third layer 126 can comprise any of the perovskite-type materials described previously with reference to layer 122, and can comprise a different degree of crystallinity than does layer 124. In particular embodiments, layer 124 is substantially crystalline, and layer 126 is substantially amorphous.

Figure 5:
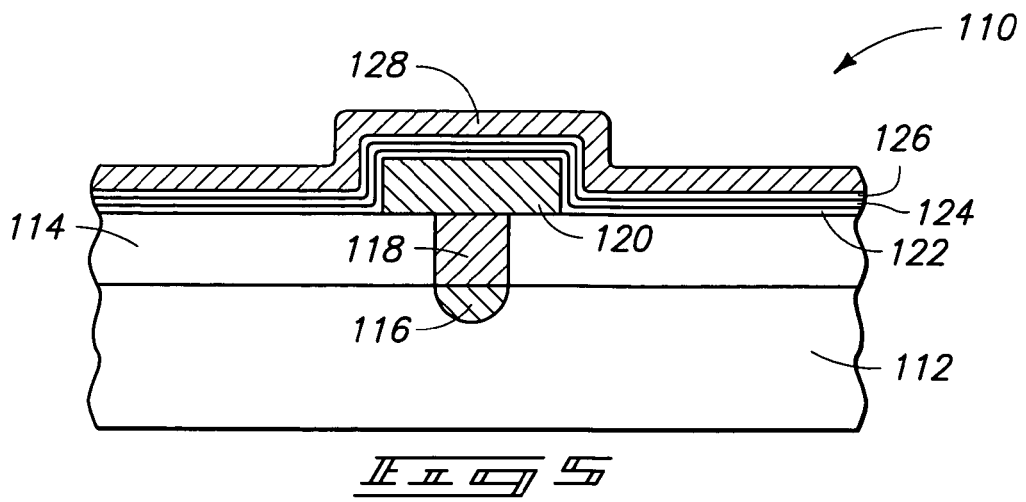
FIG. 5 is a view of the FIG. 2 wafer fragment shown at a processing step subsequent to that of FIG. 4.

Referring to FIG. 5, a second capacitor electrode 128 is formed over third perovskite-type dielectric layer 126. Second capacitor electrode 128 can comprise, for example, platinum. Capacitor electrodes 120 and 128, together with a dielectric mass defined by layers 122, 124 and 126 form a capacitor construction.

In a preferred embodiment of the present invention, dielectric layers 122 and 126 are substantially amorphous materials comprising, consisting essentially of, or consisting of barium strontium titanate, and layer 124 is a substantially crystalline material comprising, consisting essentially of, or consisting of barium strontium titanate. An advantage of utilizing the crystalline material 124 is that such can have better permitivity and dielectric properties relative to amorphous dielectric materials. However, a difficulty with crystalline perovskite-type materials can be that there will be leakage between the crystalline materials and a metallic electrode (such as, for example, a platinum electrode) if the crystalline dielectric material is in contact with the metallic electrode. Such problem can be referred to as interface-limited leakage. In contrast, amorphous materials have relatively less leakage when formed against a metallic electrode than do crystalline materials. The present invention can advantageously provide amorphous layers (122 and 126) in contact with metallic electrodes 120 and 128, while providing a substantially crystalline layer 124 between the substantially amorphous layers. Accordingly, by utilizing a stack of substantially amorphous and substantially crystalline materials, the present invention can obtain advantages associated with both the crystalline and amorphous materials in a dielectric mass. In a particular embodiment, amorphous material layers 122 and 126 will each have a thickness of from about 10 Å to about 50 Å, and the substantially crystalline layer 124 will have a thickness of from about 50 Å to about 500 Å. In particular embodiments, layers 122 and 126 can be entirely amorphous, and layer 124 can be entirely crystalline.

In an exemplary embodiment, layers 122 and 126 can be considered edge regions of a dielectric mass, with layer 122 being considered a first edge region, and layer 126 considered a second edge region. Layer 124 can then be considered as a portion which is displaced further from first electrode 120 than is edge region 122, and which has a different degree of crystallinity than does edge region 122. Alternatively, layer 124 can be considered as a portion displaced further from second capacitor electrode 128 than is second edge region 126, and which has a different degree of crystallinity than second edge region 126.

Layers 122, 124 and 126 can be formed in a common chemical deposition method, with the term "common" indicating that the chemical vapor deposition of layers 122, 124 and 126 occurs in the same reaction chamber. Further, the chemical vapor deposition of layers 122, 124 and 126 can be uninterrupted, with the term "uninterrupted" indicating that a treated wafer remains in a reaction chamber from the initial formation of layer 122 until the finish of layer 126. Layers 122, 124 and 126 can comprise a same chemical composition as one another, and vary only in crystallinity; or alternatively can comprise different chemical compositions than one another, and further vary in crystallinity.

A method of forming layers 122, 124 and 126 is to utilize the reaction process described with reference to FIG. 1, with barium, strontium and titanium precursors flowing through streams A and B, and with oxidants flowing through streams C and D. It is found that a change in oxidant can change the crystallinity of the BST layer formed. Specifically, it is found that if an oxidant is primarily a so-called strong oxidant (either $O_2$ or $O_3$), a deposited BST material will be substantially crystalline, or in particular embodiments entirely crystalline; whereas if a weaker oxidant (such as $N_2O$) is primarily utilized, the deposited film will be substantially amorphous, or in particular cases entirely amorphous. It can be preferred that layers 122 and 126 are formed utilizing an oxidant that consists essentially of, or consists of $N_2O$, and that layer 124 is formed utilizing an oxidant that consists essentially of, or consists of one or both of $O_2$ and $O_3$. Preferably, the chemical vapor deposition occurs at a temperature of less than 500° C., such as, for example, a temperature of from 450° C. to about 500° C. It is found that if a temperature exceeds 500° C., such can cause an amorphous perovskite-type material to convert to a crystalline structure.

It is noted that layers 122, 124 and 126 can be formed with abrupt interfaces separating such layers by an abrupt change from a strong oxidant (for example, $O_3$) to a weak oxidant (for example, $N_2O$). Alternatively, layers 122, 124 and 126 can be formed with gradual interfaces if there is a gradual switch from the strong oxidant to the weak oxidant. For instance, a linear gradient can be utilized in switching from the weak oxidant to the strong oxidant, and then back to the weak oxidant.

Although the shown embodiment comprises a dielectric mass with only three stacked layers, it is to be understood that more than three stacked layers can be utilized in methodology of the present invention. For instance, a dielectric material can be formed with multiple stacked layers alternating between amorphous, crystalline and amorphous; or with multiple stacked layers that comprise several amorphous layers stacked on top of each other, followed by several crystalline layers stacked on top of each other.

Although $O_3$, $O_2$, and $N_2O$ are discussed as exemplary oxidants, it is to be understood that other oxidants, including, for example, NO, $H_2O_2$ and $H_2O$ can also be utilized in methodology of the present invention.

The switch from a strong oxidant to a weak oxidant can, in particular embodiments, change not only the crystallinity associated with a perovskite-type layer, but also change a chemical composition. Accordingly, the change from a weak oxidant in forming a substantially amorphous layer 122 to a strong oxidant in forming a substantially crystalline layer 124 can result in a change of the chemical composition of barium strontium titanate in applications in which a constant and unchanged flow of barium, strontium and titanium precursors is provided within a reaction chamber.

A preferred total flow of oxidant into a process of the present invention can be anywhere from about 100 standard cubic centimeters per minute (sccm) to about 4,000 sccm, more preferably is from about 500 sccm to about 2,000 sccm, and yet more preferably is from about 750 sccm to about 1,250 sccm. A preferred pressure range within a chemical vapor deposition reactor in methodology of the present invention is preferably from about 100 mTorr to about 20 Torr, with a range of from about 1 Torr to about 6 Torr being to be more preferred. In an exemplary embodiment, the formation of dielectric materials 12, 124 and 126 occurs within an Applied Materials Centura™ frame processor. In such embodiments, susceptor temperature within the processor is preferably from about 100° C. to about 700° C., more preferably from about 400° C. to about 700° C., with less than or equal to about 550° C. being even more preferred, particularly in obtaining continuity in a deposited layer at a thickness of at or below 200 Å, and more preferably down to 50 Å. Most preferably, the susceptor temperature is kept at less than or equal to 550° C. during all of the deposit to form a perovskite-type dielectric layer. An inert gas, such as argon, is also preferably flowed to a reaction chamber downstream of oxidizer feeds, and preferably and substantially the same flow rate as a total oxidizer flow rate.

In one aspect of the invention, crystallinity gradients across a barium strontium titanate film can be adjusted by changing a flow rate and/or type of oxidant flowed into a chemical vapor deposition reactor with barium, strontium and titanium precursors. Additional and/or alternate preferred processing can occur in accordance with any of our co-pending U.S. patent application Ser. No. 09/476,516, filed on Jan. 3, 2000, entitled "Chemical Vapor Deposition Methods of Forming a High k Dielectric Layer and Methods of Forming a Capacitor", listing Cem Basceri as an inventor; and U.S. patent application Ser. No. 09/580,733, filed on May 26, 2000, entitled "Chemical Vapor Deposition Methods and Physical Vapor Deposition Methods", listing Cem Basceri as an inventor. Each of these is hereby fully incorporated by reference.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A DRAM device, comprising a perovskite-type dielectric capacitively spacing a pair of conductive nodes, the perovskite-type dielectric comprising a first layer physically contacting a first of the nodes and a second layer against the first layer and further from the first node than the first layer, said second layer having a different degree of amorphous content relative to crystalline content than the first layer, the first layer having less crystalline content than the second layer; the perovskite-type dielectric material comprising barium, strontium, titanium and oxygen throughout both the first and second layers; and wherein the perovskite-type dielectric comprises a third layer proximate the second node, wherein the second layer is between the first and third layers, and wherein the third layer has a degree of amorphous content relative to crystalline content that is about the same as the first layer.

2. The DRAM device of claim 1 wherein the first layer and third layers are substantially amorphous, and the second layer is substantially crystalline.

3. The DRAM device of claim 1 wherein the first layer comprises a thickness of from about 10Å to about 50Å; the second layer comprises a thickness of from about 50Å to about 500Å; and the third layer comprises a thickness of from about 10Å to about 50Å.

4. The DRAM device of claim 1 wherein the perovskite-type dielectric consists essentially of barium, strontium, titanium and oxygen throughout first, second and third layers.

5. The DRAM device of claim 1 wherein the perovskite-type dielectric consists of barium, strontium, titanium and oxygen throughout the first, second and third layers.

* * * * *